(12) United States Patent
Ito et al.

(10) Patent No.: US 8,425,714 B2
(45) Date of Patent: Apr. 23, 2013

(54) MANUFACTURING METHOD OF HERMETIC CONTAINER

(75) Inventors: Nobuhiro Ito, Yamato (JP); Mamo Matsumoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 13/046,883

(22) Filed: Mar. 14, 2011

(65) Prior Publication Data

US 2011/0232840 A1    Sep. 29, 2011

(30) Foreign Application Priority Data

Mar. 29, 2010   (JP) .................................. 2010-075068

(51) Int. Cl.
   *B32B 37/06* (2006.01)
(52) U.S. Cl.
   USPC ..................................... 156/275.7; 156/272.8
(58) Field of Classification Search ................ 156/272.2, 156/272.8, 275.7
   See application file for complete search history.

(56) References Cited

U.S. PATENT DOCUMENTS

| | | | |
|---|---|---|---|
| 5,426,631 A | 6/1995 | Miyazaki et al. | |
| 5,693,111 A | 12/1997 | Kadowaki et al. | |
| 5,722,031 A | 2/1998 | Fujii et al. | |
| 6,087,619 A | 7/2000 | Berkmanns et al. | |
| 6,109,994 A | 8/2000 | Cho et al. | |
| 6,113,450 A | 9/2000 | Narayanan et al. | |
| 6,517,399 B1 | 2/2003 | Ito et al. | |
| 6,817,917 B1 | 11/2004 | Kado et al. | |
| 6,926,571 B2 | 8/2005 | Ito et al. | |
| 7,039,303 B2 | 5/2006 | Kimura et al. | |
| 7,110,665 B2 | 9/2006 | Kamata et al. | |
| 7,362,038 B1 | 4/2008 | Jang et al. | |
| 7,383,875 B2 | 6/2008 | Yoshimura et al. | |
| 7,815,760 B2 | 10/2010 | Kimura et al. | |
| 7,847,474 B2 | 12/2010 | Seon | |
| 7,914,357 B2 | 3/2011 | Koyanagi et al. | |
| 7,928,645 B2 | 4/2011 | Suzuki et al. | |
| 7,972,461 B2 | 7/2011 | Hasegawa et al. | |
| 8,038,498 B2 | 10/2011 | Miyauchi et al. | |
| 2005/0151151 A1 | 7/2005 | Hawtof et al. | |
| 2005/0199599 A1 | 9/2005 | Li et al. | |
| 2006/0082298 A1 | 4/2006 | Becken et al. | |
| 2006/0084348 A1 | 4/2006 | Becken et al. | |
| 2006/0244363 A1 | 11/2006 | Seon et al. | |
| 2006/0289870 A1* | 12/2006 | Hotta et al. | ..................... 257/72 |
| 2007/0051499 A1 | 3/2007 | Kaimura et al. | |
| 2007/0200476 A1 | 8/2007 | Kijima et al. | |

(Continued)

FOREIGN PATENT DOCUMENTS

| | | |
|---|---|---|
| JP | 08-022767 A | 1/1996 |
| JP | 08-250021 A | 9/1996 |

(Continued)

*Primary Examiner* — Daniel McNally
(74) *Attorney, Agent, or Firm* — Fitzpatrick, Cella, Harper & Scinto

(57) ABSTRACT

A manufacturing method of a hermetic container, comprises: an assembling step of aligning a first glass substrate and a second substrate through a circumferential sealing material having plural straight line portions and plural coupling portions, so as to define an internal space between these substrates; and a sealing step of sealing the first glass substrate and the second glass substrate to each other, by performing a scanning step of performing scanning with local heating light, wherein the sealing step is performed in a state that local force is applied, thereby improving airtightness of the hermetic container.

11 Claims, 7 Drawing Sheets

U.S. PATENT DOCUMENTS

| | | |
|---|---|---|
| 2008/0110561 A1 | 5/2008 | Lee et al. |
| 2009/0000731 A1 * | 1/2009 | Hasegawa et al. ......... 156/272.8 |
| 2009/0066215 A1 | 3/2009 | Kweon |
| 2009/0120915 A1 | 5/2009 | Tagawa et al. |
| 2009/0221207 A1 | 9/2009 | Russell et al. |
| 2009/0229745 A1 * | 9/2009 | Lee et al. ................. 156/272.8 |
| 2010/0186350 A1 | 7/2010 | Nakazawa et al. |
| 2010/0190408 A1 | 7/2010 | Kamiguchi et al. |
| 2010/0190409 A1 | 7/2010 | Kamiguchi et al. |
| 2011/0249376 A1 | 10/2011 | Wu |

FOREIGN PATENT DOCUMENTS

| | | |
|---|---|---|
| JP | 09-208270 A | 8/1997 |
| JP | 2002-137939 A | 5/2002 |
| JP | 2002-515392 T | 5/2002 |
| JP | 2007-234334 A | 9/2007 |
| JP | 2008-059781 A | 3/2008 |
| JP | 2009-070687 A | 4/2009 |
| JP | 2009-104841 A | 5/2009 |
| JP | 2009-196859 A | 9/2009 |

* cited by examiner

MANUFACTURING METHOD OF HERMETIC CONTAINER

BACKGROUND OF THE INVENTION

1. Field of the Invention

The present invention relates to a manufacturing method of a hermetic container and, more particularly, to a manufacturing method of a hermetic container for an image display apparatus having electron-emitting devices in each of which an inside is held in a vacuum state and a phosphor film.

2. Description of the Related Art

Image display apparatuses of a flat panel type such as an organic LED display (OLED), a field emission display (FED), a plasma display panel (PDP), and the like are well known. Each of those image display apparatuses is equipped with a container which is manufactured by airtightly sealing glass substrates facing each other and of which an internal space is partitioned to an external space. To manufacture such a hermetic container, a spacing distance defining member, a local adhesive, and the like are arranged between the facing glass substrates as necessary, a sealing material is arranged in a frame shape to peripheral portions of the glass substrates, and a heat sealing process is executed. As a heating method of the sealing material, a method whereby the whole glass substrates are baked by a furnace and a method whereby a periphery of the sealing material is selectively heated by local heating have been known. The local heating is more advantageous than the whole heating from viewpoints of a time which is required to heat and cool, an energy which is required to heat, productivity, a prevention of thermal deformation of the hermetic container, a prevention of thermal deterioration of a function device arranged in the hermetic container, and the like. Particularly, a unit using a laser beam has been known as a unit for performing the local heating. Further, it has been known that such a manufacturing method of the hermetic container by using the local heating can be also applied as a manufacturing method of a vacuum insulated grazing glass which does not have a function device therein.

United States Patent Application Publication No. US2005/0151151 discloses a method of manufacturing a container of an OLED. In this method, a circumferential glass frit having a corner portion is first formed by using a first glass substrate as a support substrate, and the formed glass frit is flattened by weighting or controlling of application thickness by a dispenser. Then, the first glass substrate on which the flattened glass frit has been formed and a second glass substrate are disposed to face each other through the glass frit interposed therebetween, and the disposed substrates are assembled. Here, since local heating light is irradiated through scanning, a circumferential sealing material is melted, and thus the first glass substrate and the second substrate are airtightly adhered to each other.

Also, United States Patent Application Publication No. US2006/0082298 discloses a method of manufacturing a container of an OLED. In this method, a circumferential glass frit having a corner portion is first formed by using a first glass substrate as a support substrate. Then, the first glass substrate on which the glass frit has been formed and a second glass substrate are disposed to face each other through the glass frit interposed therebetween, and the disposed substrates are assembled. In such assembling, the first glass substrate and the second substrate are externally pressurized by means of a mechanical unit, whereby adherence in a sealing material region can be assured.

As just described, in order to assure the adherence between the sealing material and the glass substrate in the case where the laser beam is irradiated, a sealing method in which an assembling method has been variously improved, instead of a method of simply irradiating a laser beam to a glass substrate being a material to be bound and the sealing material, has been known.

However, there is a case where airtightness deteriorates due to a defective junction occurring at a coupling portion (corner portion) of the sealing material. That is, in general, the sealing material is provided so that plural straight line portions and coupling portions for connecting those straight line portions are formed on the glass substrate. In case of scanning the sealing material like this as irradiating the laser beam, generally, the scanning by the laser beam is performed for each of the straight line portions, and such an operation is repeated by the number of times corresponding to the number of the straight line portions. In case of adopting such a sealing method, the scanning is performed twice at about the same time to the coupling portion. The sealing material is softened and the thickness thereof decreases if the laser beam is irradiated to the sealing material, and the sealing material is hardened as it is immediately after the end of the irradiation of the laser beam. Further, when the laser beam is irradiated along the straight line, the glass substrate deforms toward the sealing material according to the decrease in the thickness of the sealing material, whereby a spacing distance between the glass substrates decreases.

When the laser beam reaches the region adjacent to the coupling portion, the thickness of the sealing material in the relevant region likewise decreases. However, since the laser beam is not yet irradiated to the coupling portion, the coupling portion still having the large thickness is connected to the plural straight line portions. For this reason, since the glass substrate in the coupling portion is bound or held by these straight line portions, the glass substrate does not easily deform toward the sealing material. As a result, in the region of the straight line portion adjacent to the coupling portion, since inconsistency occurs between the thickness of the sealing material and the spacing distance between the glass substrates, a defective junction thus occurs. The defective junction causes a decrease in joining strength and a decrease in airtightness.

The present invention is directed to the hermetic container manufacturing method which provides the sealing material between the glass substrates, and seals the glass substrates with each other by scanning the sealing material as irradiating the local heating light thereto. Here, the present invention aims to provide a manufacturing method of a high-reliability hermetic container which assures both of joining strength and airtightness.

SUMMARY OF THE INVENTION

The present invention aims to provide a manufacturing method of a hermetic container, which comprises: an assembling step of aligning a first glass substrate and a second substrate with each other through a circumferential sealing material having plural straight line portions and plural coupling portions for connecting the plural straight line portions, so as to define an internal space between the first glass substrate and the second glass substrate; and a sealing step of sealing the first glass substrate and the second glass substrate to each other, by performing, to all the straight line portions, a scanning step of performing scanning with local heating light along one of the straight line portions of the circumferential sealing material from one to the other of the two coupling portions positioned at both ends of the one of the straight line portions to heat and melt the one of the straight line portions. Here, the sealing step is performed in a state that local force by which, in the both ends of each of the straight line portions of the circumferential sealing material, one of the ends adjacent to another straight line portion later heated and melted is compressed in a thickness direction of the sealing material is applied.

According to the manufacturing method of the hermetic container in the present invention, it is possible to improve airtightness of the hermetic container.

Further features of the present invention will become apparent from the following description of the exemplary embodiments with reference to the attached drawings.

DESCRIPTION OF THE EMBODIMENTS

Hereinafter, the exemplary embodiments of the present invention will be described with reference to the attached drawings. Although a container which is used as a hermetic container in image display apparatuses such as an FED, an OLED, a PDP and the like will be described hereinafter, the hermetic container of the present invention is not limited to them but can be applied to all containers which are airtightly sealed. There is a vacuum insulated grazing glass container as an example of such a hermetic container.

In particular, a manufacturing method of the hermetic container according to the present invention can be desirably applied to a manufacturing method of a container having an evacuated internal space. In the image display apparatus such as an FED or the like having the pressure-reduced internal space, a joining strength which can cope with an atmospheric pressure caused by a negative pressure of the internal space is required. However, according to the manufacturing method of the hermetic container according to the present invention, both of an assurance of the joining strength and airtightness of the internal space can be accomplished.

Figure 7:
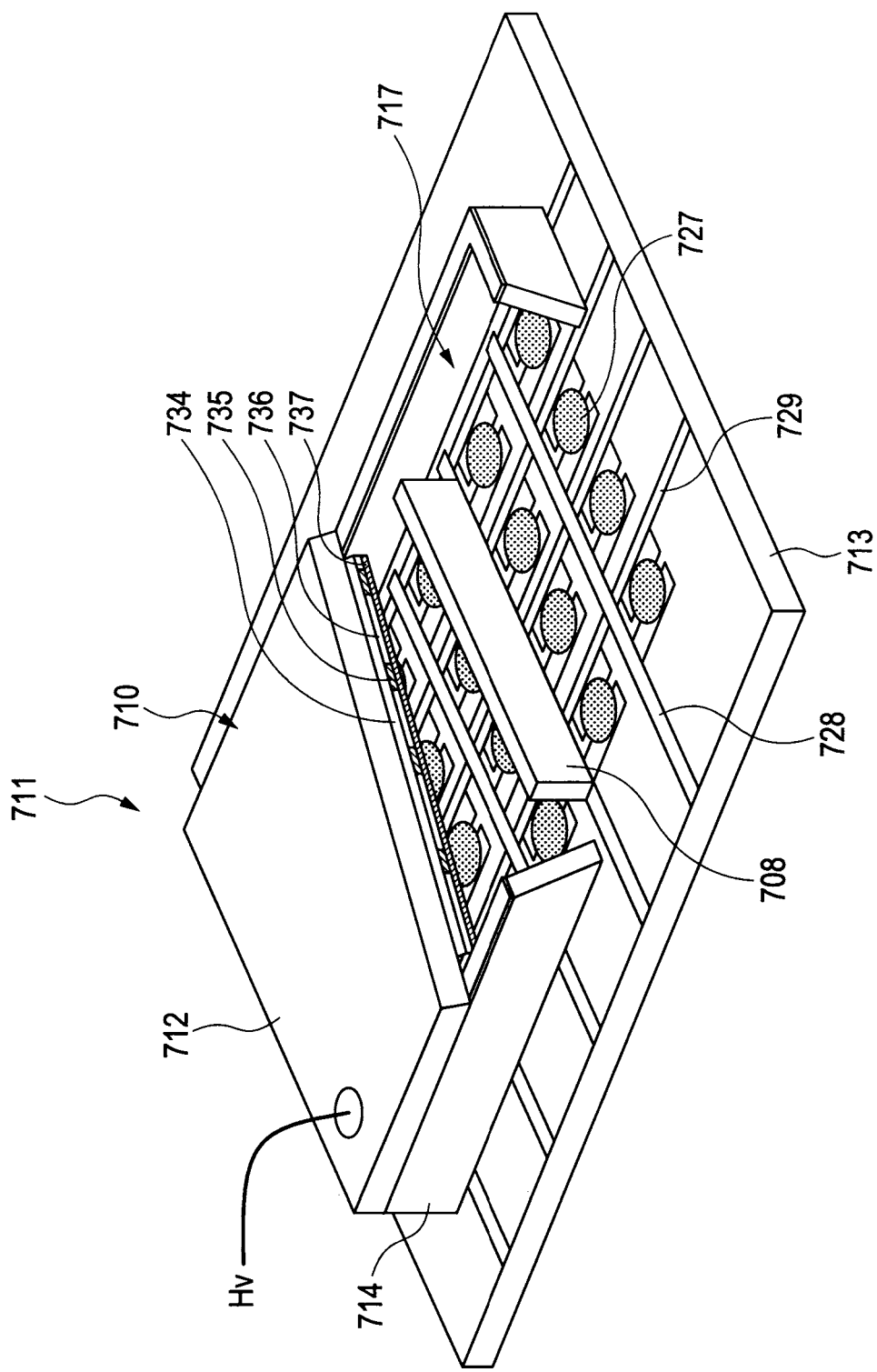
FIG. 7 is a cross sectional perspective view illustrating a construction of an FED to which the manufacturing method of the hermetic container according to the present invention is applicable.

FIG. 7 is a perspective view with a part cut away illustrating an example of an image display apparatus having the hermetic container. A container (hermetic container) 710 of an image display apparatus 711 has a face plate 712, a rear plate 713, and a frame member 714, each of which is made of glass. The frame member 714 is arranged between the face plate 712 in a flat plate shape and the rear plate 713 in a flat plate shape, and a sealed internal space 717 is formed between the face plate 712 and the rear plate 713. More specifically, the face plate 712 and the frame member 714 and the rear plate 713 and the frame member 714 are respectively bound in such a manner that their facing surfaces are bound through a sealing material, so that the container 710 having the sealed internal space 717 is formed. The internal space 717 of the container 710 is maintained in a vacuum state. Spacing distance defining members (spacers) 708 which specify a spacing distance between the face plate 712 and the rear plate 713 are provided at a predetermined pitch. The face plate 712 and the frame member 714 or the rear plate 713 and the frame member 714 may be preliminarily sealed or may be integrally formed.

A number of electron-emitting devices 727 for emitting electrons in response to an image signal are provided on the rear plate 713. Matrix wirings for driving (X-directional wirings 728, Y-directional wirings 729) for making each of the electron-emitting devices 727 operative in response to the image signal are formed on the rear plate 713. A phosphor film 734 made of phosphor which receives an irradiation of the electrons emitted from the electron-emitting devices 727, emits light, and displays an image is provided on the face plate 712 located so as to face the rear plate 713. Black stripes 735 are further provided on the face plate 712. The phosphor film 734 and the black stripes 735 are alternately arranged. A metal back 736 made of an aluminum (Al) thin film is formed on the phosphor film 734. The metal back 736 has a function as an electrode for attracting electrons and receives a supply of an electric potential from a high voltage terminal Hv provided on the container 710. A non-evaporable getter 737 made of a titanium (Ti) thin film is formed on the metal back 736.

It is sufficient that the face plate 712, the rear plate 713, and the frame member 714 are transparent and have a translucent property. Accordingly, soda-lime glass, glass having a high strain point, no-alkali glass, or the like can be used. It is desirable that, at a used wavelength of local heating light and in an absorption wavelength band of the sealing material, which will be described later, those members 712, 713, and 714 have excellent translucency. The rear plate 713 is desirable from a viewpoint of suppressing a residual stress to the hermetic container so long as it is a material whose linear expansion coefficient coincides with that of each of the frame member 714 and the face plate 712.

Subsequently, the manufacturing method of the hermetic container according to the present invention will be described with reference to FIGS. 1A, 1B, 1C and 1D. Each of FIGS. 1A to 1D illustrating a stage of each step includes two diagrams. A plan view when the whole circumferential sealing material is seen is illustrated on the right side. A cross sectional view which perpendicularly crosses the surface of the face plate is illustrated on the left side. The manufacturing method of the hermetic container has an assembling step and a sealing step. A first glass substrate and a second glass substrate constituting the hermetic container are prepared as a preparation stage.

A specific example of each component member constituting the hermetic container will be described hereinafter. First, the face plate 712 having phosphor (not illustrated), the black stripes and the metal back, the frame member 714, and the rear plate 713 are prepared. A glass frit (not illustrated) is formed onto the phosphor-formed surface of the face plate 712 by printing and baking. The glass frit and the frame member 714 come into contact with each other, are temporarily assembled by a pressurizing member (not illustrated), and are airtightly sealed and integrated in an atmospheric firing furnace. Thus, the first glass substrate in which the frame member 714 and the face plate 712 have been integrated in this manner is prepared.

A sealing material 701 made of the glass frit is formed in the portion of the frame member 714 of the face plate (first glass substrate) 712 integrated with the frame member 714, by the printing and baking.

The sealing material 701 which seals the first glass substrate with a later-described second glass substrate is a circumferential sealing material having plural straight line portions 701a and curved coupling portions (corner portions) 701b for connecting the straight line portions 701a (refer to FIG. 1A). Although the circumferential sealing material 701 has an almost rectangular frame shape on the assumption that the hermetic container is used as the container for the image display apparatus in the present embodiment, the circumferential sealing material 701 is not limited to such a shape but may have an arbitrary polygonal frame shape.

The straight line portion 701a indicates a rectangular region surrounded by both rectilinearly extending edge sides of the sealing material. The coupling portion 701b indicates a transition region adapted to shift from one straight line portion to another straight line portion (refer to FIG. 1A). Although the coupling portion 701b is bent along a smooth curve in the examples illustrated in FIGS. 1A to 1D, the coupling portion may have a shape bent at an arbitrary angle. In this case, for example, the coupling portion has a square or rectangular shape in which two adjacent sides are connected to the straight line portion. Incidentally, although each boundary line between the straight line portion 701a and the coupling portion 701b is illustrated for convenience of description in FIG. 1A, actually, the circumferential sealing material 701 is integrally formed.

The matrix wirings constituted by the plural X-directional wirings 728 and the plural Y-directional wirings 729 illustrated in FIG. 7 and the electron-emitting devices connected to intersecting portions of the matrix wirings are provided on the rear plate (second glass substrate) 713.

The frame member 714, the sealing material 701 and the like may be formed on the face plate 712 in arbitrary order. It is not always necessary to previously integrate those members but the frame member 714 and the face plate 712 may be sealed after or during a sealing step, which will be described later. In the above example, a matter in which the frame member 714 and the face plate 712 are integrated is used as the first glass substrate, and the rear plate 713 is used as the second glass substrate. However, the face plate 712 may be used as the first glass substrate and a matter in which the frame member 714 and the rear plate 713 are integrated may be used as the second glass substrate.

Although the sealing material 701 is printed and formed onto the frame member 714, a sheet frit or the like serving as the sealing material 701 can be also arranged between the frame member 714 and the rear plate 713 in place of such a method. As for the sealing material 701, it is desirable that its viscosity has a negative temperature coefficient (temperature dependency), the material is softened at a high temperature, and its softening point is lower than that of each of the face plate 712, the rear plate 713, and the frame member 714. As an example of the sealing material 701, a glass frit, an inorganic adhesive, an organic adhesive, or the like can be mentioned. It is desirable that the sealing material 701 shows a high absorption property to a wavelength of the later-described local heating light. In the case where the hermetic container 710 is used as the container or the like for the FED in which it is required to maintain a vacuum degree of the internal space 717, a glass frit, an inorganic adhesive, or the like which can suppress decomposition of residual hydrocarbon is desirably used as the sealing material 701.

Figure 1A:
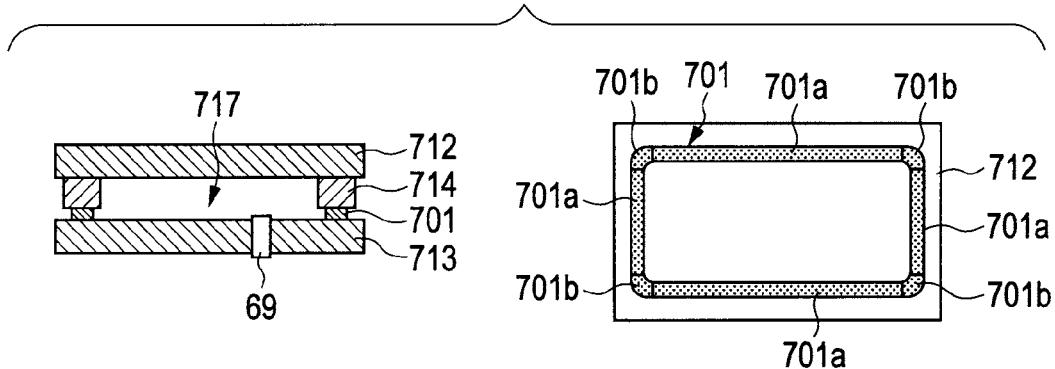
FIGS. 1A, 1B, 1C and 1D are cross sectional views and plan views illustrating an example of a manufacturing method of a hermetic container according to an embodiment of the present invention.

In the assembling step, as illustrated in FIG. 1A, the first glass substrate 712 and 714 and the second glass substrate 713 are sealed through the circumferential sealing material 701 having the plural straight line portions 701a and the plural coupling portions 701b for connecting the plural straight line portions 701a. In this manner, the internal space 717 is defined between the first glass substrate 712 and 714 and the second glass substrate 713. In the assembling step, it is desirable that the spacers 708 are arranged as the spacing distance defining members so that a state where the internal space 717 is maintained to a negative pressure to the outside can be assured during the sealing step later performed (also refer to FIG. 7).

If an exhaust hole 69 is provided on any one of the face plate 712, the rear plate 713 and the frame member 714 by this stage, it is desirable because it is possible to set the internal space 717 to a negative pressure through the exhaust hole 69.

Incidentally, the exhaust hole 69 to evacuate air in the internal space 717 may be provided on the rear plate 713 as illustrated in FIG. 1A or may alternatively be provided on the face plate 712. Besides, the exhaust hole 69 may be provided on the frame member 714. In this manner, the position of the exhaust hole 69 can be arbitrarily selected to any position from the members constituting the hermetic container in accordance with a use form and an application of the hermetic container.

In the following description, there is a case where the members (the first glass substrate, the second glass substrate and the whole sealing material) which define the internal space 717 in the state where the above-described component elements have been assembled in the assembling step are called "assembly structure".

In the sealing step to be performed after the assembling step, a scanning step of performing scanning with the local heating light along one of the straight line portions of the circumferential sealing material from one to the other of the two coupling portions positioned at the both ends of the one of the straight line portions to heat and melt the one of the straight line portions is performed in turn to all the straight line portions 701a, thereby sealing the first glass substrate and the second glass substrate. The sealing step is performed in a state that local force by which, in the both ends of each of the straight line portions 701a of the circumferential sealing material, one of the ends adjacent to other straight line portion later heated and melted is compressed in a thickness direction of the sealing material is applied.

Figure 1B:
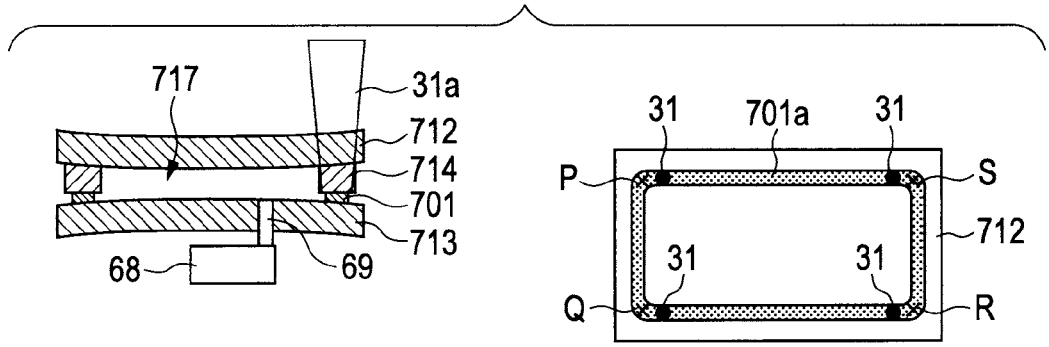

A concrete example of the sealing step will be described hereinafter. In the present embodiment, as illustrated in FIG. 1B, the sealing materials at both end portions 31 of one of the two straight line portions 701a corresponding to sides QR and SP are heated and melted by local heating light 31a. Then, when the heated and melted sealing materials are hardened, the first glass substrate and the second glass substrate are temporarily sealed to each other at the end portions 31 of the two straight line portions 701a. By such temporary sealing, the local force by which a sealing portion at a predetermined position is compressed in the thickness direction of the sealing material is applied.

Figure 1C:
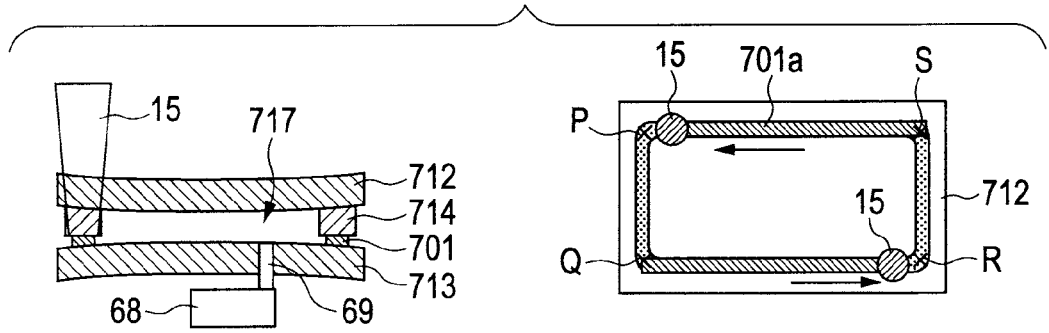
Figure 1D:
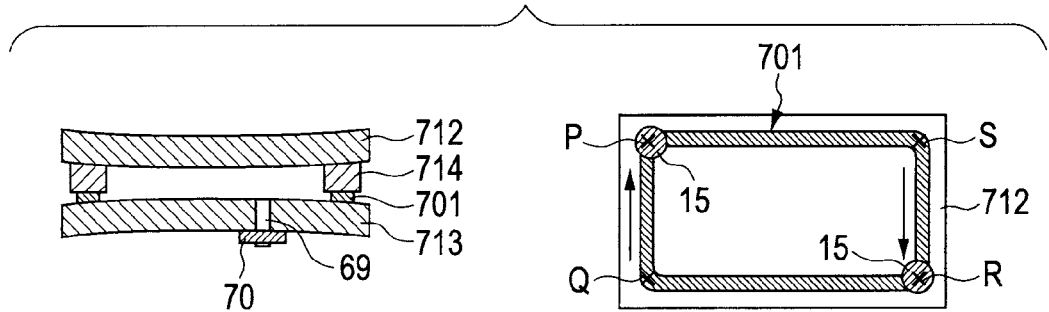

Subsequently, scanning is precedently performed with irradiation of local heating light 15 to the two straight line portions 701a corresponding to the sides QR and SP as illustrated in FIG. 1C, and scanning is then performed with irradiation of the local heating light 15 to the remaining two straight line portions 701a corresponding to sides RS and PQ as illustrated in FIG. 1D. Here, the scanning is performed with the local heating light 15 along the straight line portion 701a from one to the other of the two coupling portions 701b positioned at the both end portions of the straight line portion 701a. Consequently, each of the coupling portions 701b is irradiated at least twice by the local heating light 15. It is desirable that the scanning with the local heating light 15 to each of the coupling portions 701b of the sealing material is performed at least twice respectively in inverse directions.

Figure 2A:
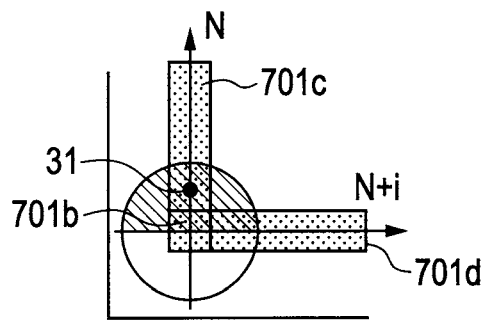
FIGS. 2A, 2B, 2C, 2D and 2E are partial enlarged views for describing a method of applying local force in the embodiment of the present invention.

More specifically, as illustrated in FIG. 2A, at least two scanning operations, i.e., Nth scanning and (N+i)th scanning, are performed to the coupling portion 701b. Here, N is a natural number to be selected from 1 to M−1, M is the number of the sides of the sealing material, i.e., the number of the straight line portions, which is a natural number of 3 or more, and i is a natural number to be selected within a range of 1 to M−1.

In the present embodiment, to apply the local force in the sealing step, the vicinity of the end portion of the straight line portion 701a of the sealing material to be precedently heated and melted in the sealing step is previously heated and melted by local heating light 31a and then hardened before the sealing step.

Figure 2C:
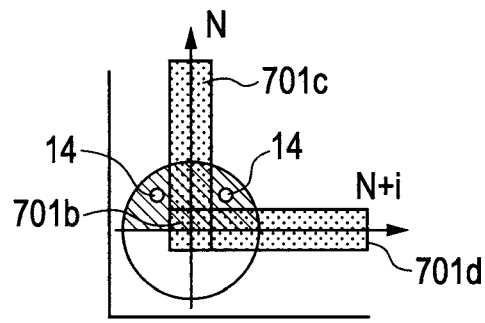
Figure 2B:
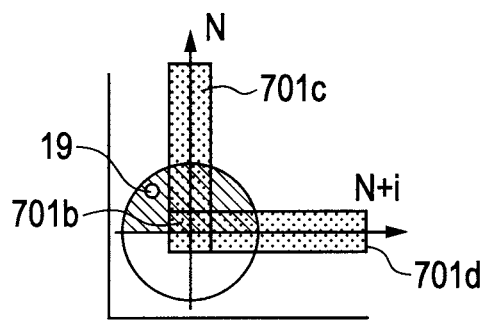

As another method of applying the local force, as illustrated in FIG. 2B, a method of previously providing, in the vicinity of the end portion of the straight line portion 701a of the sealing material, another sealing material (local sealing material) 19 locally contacting both the first glass substrate and the second glass substrate in the assembling step may be adopted. In this case, if the local sealing material 19 is melted and hardened before the sealing step, the local force for compressing the vicinity of the coupling portion 701b of the sealing material in the thickness direction of the sealing material can be applied. The ingredient of the local sealing material 19 may not be the same as that of the sealing material 701. However, if these ingredients are made identical, there is an advantage that a step of forming the sealing materials is simplified.

As still another method of applying the local force, as illustrated in FIG. 2C, a method of locally pressurizing the vicinity of the coupling portion 701b of the sealing material from the outside of the two glass substrates by means of a pressurizing tool 14 or the like may be adopted. In this case, as illustrated in FIG. 2C, the first and second glass substrates positioned at the both sides of the straight line portion 701a of the sealing material may be pressurized.

Figure 2D:
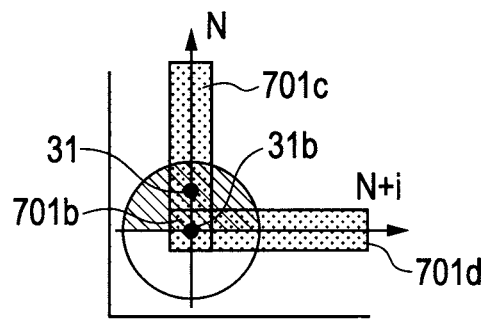

As illustrated in FIG. 2D, if the local force is applied to a position 31b on the coupling portion 701b of the sealing material in addition to the end portion 31 of the straight line portion 701a, it is more desirable to improve a defective junction.

It is desirable that the internal space 717 is maintained to a negative pressure to an outside during the sealing step. This is achieved by decreasing the pressure in the internal space 717 with use of an evacuating apparatus 68 connected to the exhaust hole 69. Alternatively, the internal space 717 may be maintained to the negative pressure to the outside by increasing the pressure outside the assembly structure.

The several methods of applying the local force have been exemplarily described as above. Incidentally, it is desirable that the region to which the local force is applied, that is, a local sealing region or a pressurizing region, is within a region described hereinafter.

Figure 2E:
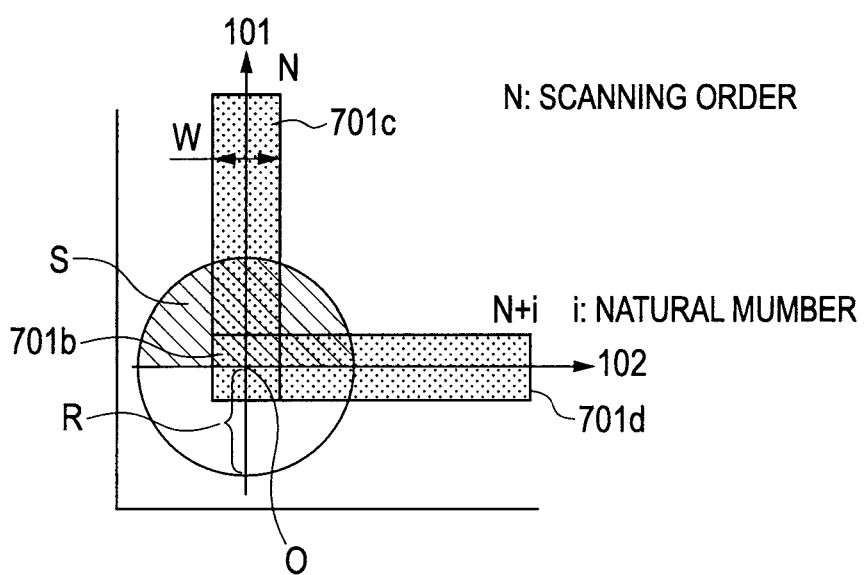

The region to which the local force is applied is a region S which is positioned at the end of a straight line portion 701c, in the two straight line portions adjacent to the coupling portion 701b of the sealing material, which is precedently irradiated or in the vicinity of the end thereof. When the force is applied to the relevant region S, the end of the straight line portion 701c which is positioned adjacent to another straight line portion 701d to be later heated and melted can be compressed. More specifically, as illustrated in FIG. 2E, an intersection point O of a first center line 101 of the straight line portion 701c being one of the two straight line portions 701c and 701d stretching in two sides from the coupling portion 701b and a second center line 102 of the straight line portion 701d being the other of the two straight line portions and a width W of the straight line portion 701c (i.e., the straight line portion precedently heated and melted) are assumed. Further, a circle of a radius R which centers on the intersection point O is assumed. At this time, it is desirable that the region to which the local force is applied is the semicircular region S which is surrounded by the circumference of the radius R and the second center line 102 of the straight line portion 701d and positioned on the inner side of the circumferential sealing material, i.e., on the side closer to the internal space. Further, it is desirable that the radius R of the above circle is equal to a value which is two or less times as large as the width W of the straight line portion 701c which is precedently heated and melted. It is possible, by applying the local force within the region S like this, to further suppress deterioration of airtightness of the hermetic container.

Hereinafter, a problem (i.e., a problem to be solved by the present invention) which occurs when the sealing materials are heated and melted in turn by the local heating light and thus the glass substrates are mutually sealed will be described with reference to FIGS. 5A, 5B and 5C.

In a case where viscosity of the sealing material has a negative temperature coefficient, fluidity increases when the sealing material is heated, and the sealing material is hardened when the sealing material is cooled. Thus, interference adherence between the sealing material and the glass substrate is high due to the fluidity in the heating of the sealing material. Then, the sealing material is hardened and fixed in its state when the sealing material is cooled. As just described, it is desirable in the manufacturing of the hermetic container that the viscosity of the sealing material has the negative temperature coefficient. Hereinafter, the film thickness of the sealing material which is sandwiched between the pair of the glass substrates at this time will be described.

In general, the film thickness of the sealing material heated and melted (softened) decreases by the pressure from the pair of the glass substrates. Then, when the sealing material is cooled, the film thickness of the sealing material is fixed in its state. FIG. 5A shows a film thickness distribution of the sealing material before irradiation of the local heating light, FIG. 5B shows an ideal film thickness distribution of the sealing material hardened after heating and melting of the sealing material, and FIG. 5C shows an actual film thickness distribution obtained when the scanning with the local heating light is performed to the straight line portion of the sealing material. In the drawings, the X and Y axes indicate the coordinates in the plane where the sealing material exists, and the Z axis indicates a size of the film thickness. Each of FIGS. 5A to 5C illustrates the coupling portion of the sealing material and the film thicknesses of the two straight line portions stretching from the coupling portion.

Figure 5A:
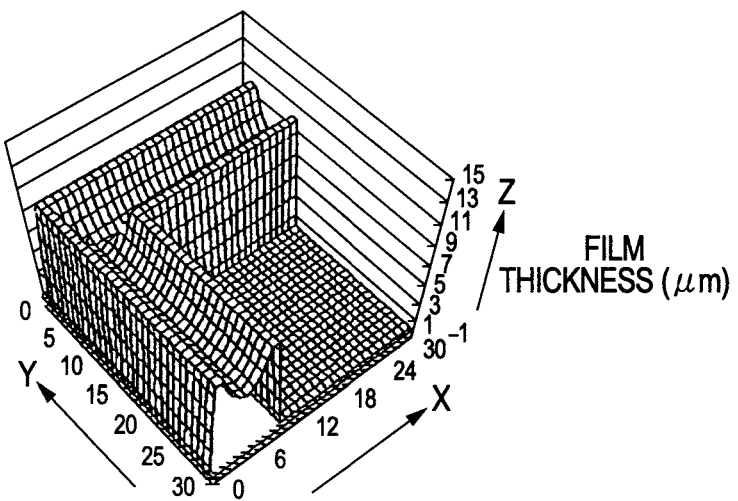
FIGS. 5A, 5B and 5C are partial perspective views illustrating the periphery of a coupling portion of a sealing material, for describing a problem to be solved by the present invention.
Figure 5B:
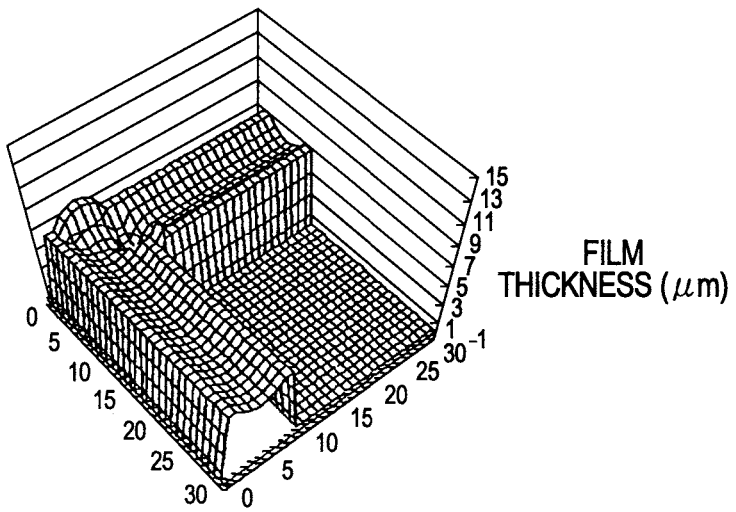
Figure 5C:
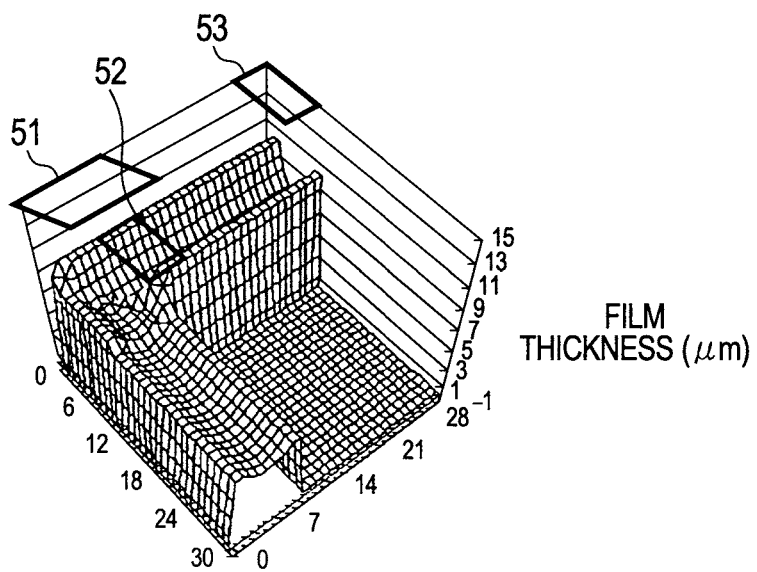

When one of the straight line portions (i.e., the straight line portion stretching in the Y-axis direction) illustrated in FIG. 5A is heated and melted by the local heating light, the film thickness of the heated and melted portion decreases (refer to FIG. 5C). Subsequently, when the other of the straight line portions (i.e., the straight line portion stretching in the X-axis direction) illustrated in FIG. 5A is heated and melted by the local heating light, it is ideally desirable that an even film thickness distribution as illustrated in FIG. 5B is obtained. However, as a result of consideration by the inventors of the present invention and the like, it has been turned out that the ideal thickness distribution as illustrated in FIG. 5B might not be obtained.

More specifically, a defective junction occurred in the portion indicated by a region 52 in FIG. 5C, i.e., the region in the vicinity of the straight line portion precedently irradiated by the local heating light. It has been turned out by the inventors of the present invention and the like that the relevant defective junction arises from the fact that, since the film thickness of the sealing material in the unsealed state (i.e., the straight line portion later heated and melted) is large, the sealing material in the portion indicated by a region 51 supports the glass substrate as a support pillar and thus a gap is formed between the sealing material in the portion indicated by the region 52 and the glass substrate. Thus, defective adherence of the sealing material occurs in the vicinity of the end of the straight line portion precedently heated and melted. Also, a defective junction slightly occurred in a region 53 of the sealing material later heated and melted.

Figure 6A:
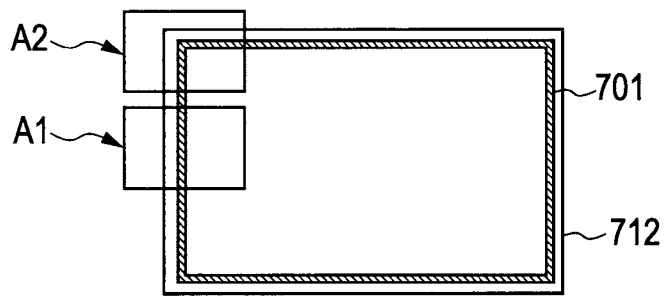
FIGS. 6A, 6B, 6C, 6D and 6E are cross sectional views and plan views illustrating a hermetic container, for describing the problem to be solved by the present invention.
Figure 6B:
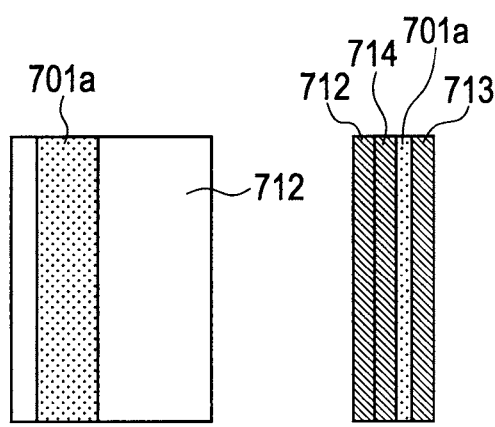
Figure 6C:
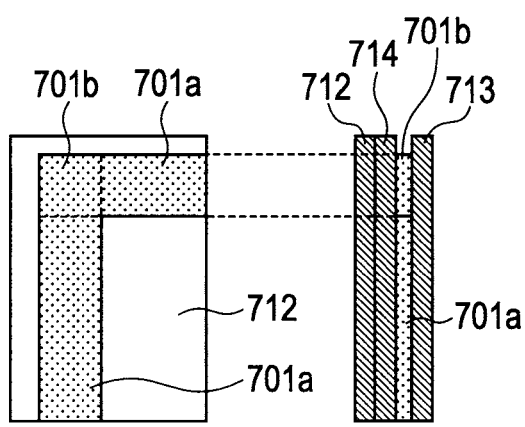

The influence of the above matters in the straight line portions and the coupling portion will be described with reference to FIGS. 6A, 6B, 6C, 6D and 6E. FIG. 6A is the plan view of the face plate 712, FIG. 6B is the plan and cross sectional views indicating the straight line portion (a region A1 in FIG. 6A) before the heating and melting, and FIG. 6C is the plan and cross sectional views indicating the vicinity of the coupling portion (a region A2 in FIG. 6A) before the heating and melting. As indicated in FIGS. 6B and 6C, the sealing material and the glass substrates 713 and 714 are tightly adhered at the straight line portion 701a and the coupling portion 701b in the sealing portion before the heating and melting.

Figure 6D:
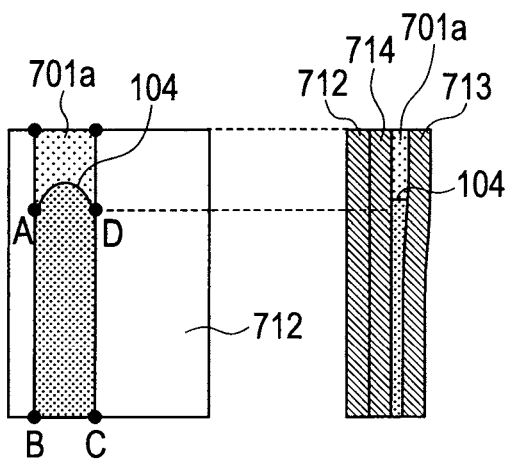
Figure 6E:
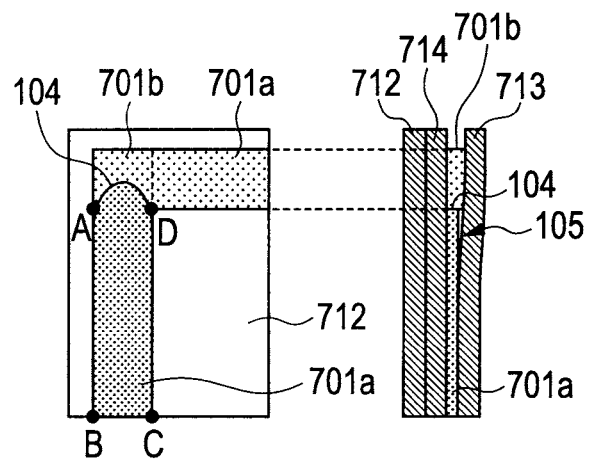

FIG. 6D is the plan and cross sectional views indicating the straight line portion 701a after only a region ABCD illustrated is heated and melted, and FIG. 6E is the plan and cross sectional views indicating the vicinity of the coupling portion 701b after only the region ABCD illustrated is heated and melted.

As indicated in FIG. 6D, when a boundary 104 between the sealing material in the sealed state and the sealing material in the unsealed state is in the straight line portion 701a, a difference in film thickness occurs between the sealing material in the sealed state and the sealing material in the unsealed state. However, since the glass substrate 713 continuously deforms according to the film thickness of the sealing material 701a, the adherence between the sealing material 701a and the glass substrates 713 and 714 are assured.

As illustrated in FIG. 6E, even when the boundary 104 between the sealing material in the sealed state and the sealing material in the unsealed state is in the coupling portion 701b of the sealing material, a difference in film thickness occurs between the sealing material in the sealed state and the sealing material in the unsealed state, and the sealing material in the unsealed state stretches from the coupling portion 701b of the sealing material in the direction perpendicular to (or intersecting with) the straight line portion after the sealing. In this case, since the film thickness of another straight line portion in the unsealed state intersecting with the straight line portion after the sealing is large, the relevant straight line portion acts as the support pillar for holding the spacing distance between the glass substrates. Thus, unlike the case illustrated in FIG. 6D, since the straight line portion in the unsealed state prevents the glass substrate from deforming, a gap 105 occurs between the sealing material and the glass substrate, whereby the adherence between the sealing material and the glass substrate deteriorates.

According to the manufacturing method of the hermetic container in the present invention, the sealing step is performed in the state that the local force by which, in the both ends of each of the straight line portions of the circumferential sealing material, one of the ends adjacent to the other straight line portion later heated and melted is compressed in the thickness direction of the sealing material is applied. Thus, the inventors of the present invention and the like found that, since the local force can be applied to the boundary between the sealing material in the sealed state and the sealing material in the unsealed state, a defective junction in the vicinity of the coupling portion of the sealing material can be suppressed.

As just described, in case of locally pressurizing the end portions 31 illustrated in FIG. 1B, the local heating light may be precedently irradiated to either the side QR or the side SP. Alternatively, the local heating light 15 may be simultaneously irradiated to both the sides QR and SP. Likewise, the local heating light 15 may be precedently irradiated to the straight line portion 701a on either the side RS or the side PQ. Alternatively, the local heating light may be simultaneously irradiated to both the sides. Moreover, the scanning direction (i.e., the directions indicated by the arrows respectively in FIGS. 1C and 1D) of the local heating light 15 may be inverted.

Figure 3A:
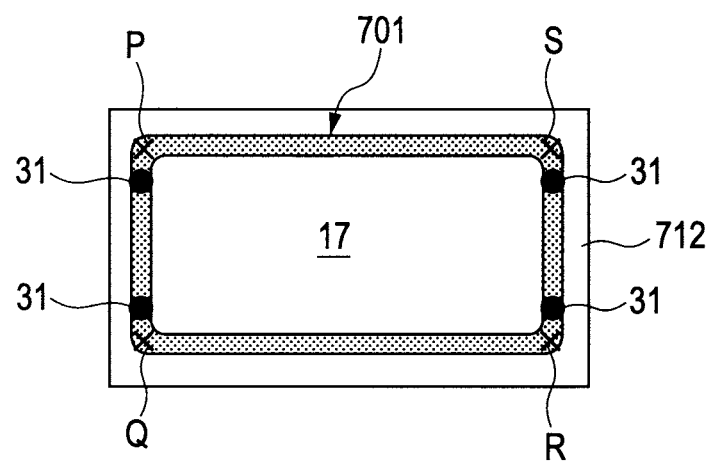
FIGS. 3A and 3B are plan views for describing a method of applying local force in another embodiment of the present invention.

In another aspect, the position to which the local force is applied may be the positions of the end portions 31 indicated in FIG. 3A. In this case, the local heating light is irradiated to the straight lint portions of the sealing material in order of the sides PQ, SR, PS and RQ. In the case where the end portions 31 to which the local force is applied are arranged as described above, the irradiation order to the side PQ may be changed for the irradiation order to the side SR, and the irradiation order to the side RQ may be changed for the irradiation order to the side PS. Even in such cases, since the vicinity of the end portion of the straight line portion precedently heated and melted is compressed by the local force, the adherence between the sealing material 701 and the glass substrate 712 improves, whereby it is possible to reduce the defective junction of the hermetic container.

Figure 3B:
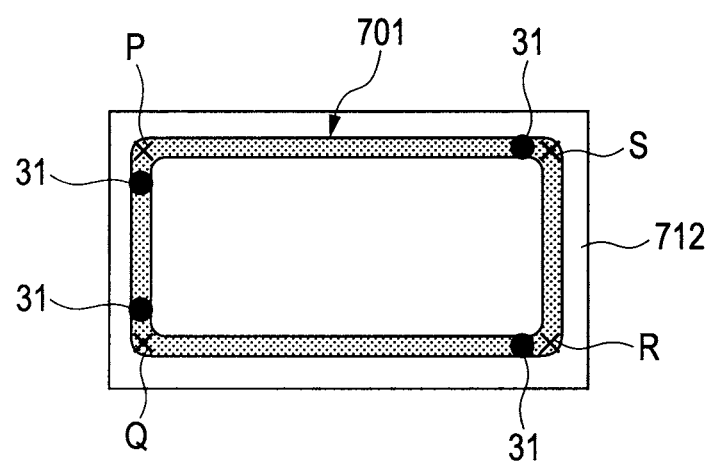

In still another aspect, the position to which the local force is applied may be the positions of the end portions 31 indicated in FIG. 3B. In this case, the local heating light is irradiated to the straight lint portions of the sealing material in order of the sides PQ, RQ, PS and SR. In the case where the end portions 31 to which the local force is applied are arranged as described above, the irradiation order to the side PQ may be changed for the irradiation order to the side QR. Even in such a case, since the vicinity of the end portion of the straight line portion precedently heated and melted is compressed in the thickness direction of the sealing material by the local force, the adherence between the sealing material 701 and the glass substrate 712 improves, whereby it is possible to reduce the defective junction of the hermetic container.

When all the straight line portions 701a of the sealing material 701 are sealed and the sealing step ends, then the hermetic container which has the airtight internal space 717 is completed. Incidentally, in case of vacuumizing the internal space 717 of the hermetic container, as illustrated in FIG. 1D, it only has to reduce the pressure of the internal space 717 after the sealing step and then seal the exhaust hole by a cover member 70. Further, in case of maintaining the internal space 717 to the negative pressure during the sealing step, it only has to release the reduced pressure of the internal space 717 of the hermetic container, evacuate the internal space 717, and then seal the exhaust hole 69. Alternatively, it is possible to seal the exhaust hole 69 as maintaining the negative pressure of the internal space 717.

Hereinafter, concrete examples of the above-described embodiment of the present invention will be described in detail.

First Example

In this example, the above-described manufacturing method of the hermetic container is applied, an integrated matter of the frame member and the face plate and the rear plate are airtightly sealed, further, the pressurization is cancelled, and after that, while the internal space is again evacuated from the exhaust hole, the exhaust hole is sealed by the cover member. In this manner, a vacuum hermetic container which can be applied as a container for the FED is manufactured.

First, a face plate is prepared. The face plate is formed by cutting a high strain point glass substrate having a thickness of 1.8 mm (PD200: made by Asahi Glass Co., Ltd.) into a plate glass shape having an external shape of 980 mm×570 mm×1.8 mm by a cutting work. Subsequently, the surface of the face plate is degreased by an organic solvent cleaning, a deionizing rinse, and a UV-ozone cleaning. Then, by forming phosphor, a black matrix and an anode as patterns onto the face plate, an image forming region is formed onto one surface of the face plate. Subsequently, a non-evaporable getter made of metal Ti is formed onto the anode by a sputtering method. Then, a sealing material made of a glass frit is formed on the outside of the image forming region on the face plate by a screen printing and an atmosphere heating. In this manner, the face plate with the sealing material is prepared.

Subsequently, a frame member is prepared. More specifically, a high strain point glass substrate having a thickness of 1.5 mm (PD200) is cut into a size having an external shape of 960 mm×550 mm×1.5 mm. A region of 950 mm×540 mm×1.5 mm at the center region of the glass substrate having such a size is cut out by the cutting work, thereby forming the almost quadrangular frame member in which a straight line portion has a width of 5 mm and a height of 1.5 mm. Then, in a manner similar to the face plate, the surface of the frame member is degreased by the organic solvent cleaning, the deionizing rinse, and the UV-ozone cleaning.

Subsequently, the surface (having the phosphor pattern) of the prepared face plate with the sealing material and the frame member come into contact with each other, are temporarily assembled by a pressurizing tool (not illustrated), and are sealed and integrated without gaps by an atmospheric firing furnace, thereby preparing the face plate (first glass substrate) with the integrated frame member.

Subsequently, the sealing material is formed on the frame member. In this example, a glass frit is used as the sealing material. The glass frit used is such a paste that a Bi system lead-free glass frit (BAS115: made by Asahi Glass Co., Ltd.) having a thermal expansion coefficient of $\alpha=79\times10^{-7}/°$ C., a transition point of 357° C., and a softening point of 420° C. is used as a base material, and an organic substance is dispersed and mixed as a binder. Subsequently, a sealing material having a width of 1 mm and a thickness of 7 µm is formed along the circumferential length on the frame member by the screen printing. Each face plate with the integrated frame member serving as the first glass substrate is dried at 120° C. In order to burn out the organic substance, it is heated and baked at 460° C., thereby forming the sealing material. In this manner, the integrated matter of the sealing material, the frame member, and the face plate serving as the first glass substrate is prepared.

Subsequently, as a rear plate, a glass substrate having a size of 990 mm×580 mm×1.8 mm and made of high strain point glass (PD200: made by Asahi Glass Co., Ltd.) is prepared. Then, an exhaust hole having a diameter of 2 mm is formed in a region out of the image forming region of the rear plate by the cutting work. Subsequently, in a manner similar to those of the face plate and the frame member, after the rear plate was cleaned, the electron-emitting devices and the matrix wirings for driving (not illustrated) are formed. The non-evaporable getter made of a metal (Ti) (not illustrated) is formed on the matrix wirings for driving by the sputtering method. Subsequently, spacing distance defining members (spacers) are arranged on scanning signal wirings.

Subsequently, the integrated matter of the sealing material, the frame member and the face plate serving as the first glass substrate and the electron-emitting device plate (rear plate) are arranged in such a manner that the surface formed with the phosphor pattern and the surface formed with the electron-emitting device face each other. Thus, the assembly structure which defines the internal space 717 is formed as illustrated in FIG. 1A.

Subsequently, the evacuating apparatus comprising the scroll pump and the turbo-molecular pump is connected to the exhaust hole 69 through the exhaust pipe, thereby evacuating until the atmospheric pressure of the internal space 717 reaches $1\times10^4$ Pa as illustrated in FIG. 1B.

Subsequently, as illustrated in FIG. 1B, while maintaining the vacuum degree of the internal space 717, a laser beam serving as the local heating light is irradiated to the vicinity of the coupling portion of the sealing material (i.e., the vicinity of the both end portions of the two straight line portions), thereby locally sealing the frame member and the rear plate to each other. By such local sealing, the local force is applied to the assembly structure in the sealing step.

Subsequently, while maintaining the pressurizing state to the assembly structure, as illustrated in FIG. 1C, the local heating light 15 is irradiated to the sealing material 701. More specifically, while irradiating a laser beam serving as the local heating light 15, the four sides are sequentially scanned in order of Q→R, S→P, R→S, and P→Q. Thus, each of the four corner portions is scanned twice, whereby the rear plate and the frame member are airtightly sealed.

At this time, as for the local heating light 15, two semiconductor laser apparatuses for working (not shown) are prepared and arranged in such a manner that irradiation spots of a first laser light source and a second laser light source are aligned on a straight line.

As the first laser light source, a laser beam having a wavelength of 980 nm, a laser power of 212 W, and an effective diameter of 2 mm is used and scanned at a speed of 1000 mm/sec. The second laser light source is arranged behind the first laser light source in the scanning direction with a delay time of 0.05 seconds, that is, by a distance of 50 mm as an irradiation spot, and this spacing distance is also maintained during the scanning operation. At this time, as a laser beam from the second laser light source, a laser beam having a wavelength of 980 nm, a laser power of 212 W, and an effective diameter of 2 mm is used.

Subsequently, the evacuating apparatus and the exhaust pipe are removed from the exhaust hole, and the pressure reduction of the internal space is once cancelled. After that, while the internal space 717 is evacuated from the exhaust hole 69, the whole hermetic container is heated in a cart type furnace having a cover sealing apparatus (not illustrated) in the furnace. The internal space 717 is evacuated by the non-evaporable getter, the cover is sealed, and the vacuum hermetic container is completed.

The hermetic container is manufactured in this manner, a driving circuit and the like are further attached by an ordinary method, and an FED apparatus having the hermetic container is completed. The completed FED was made operative, so that it has been confirmed that the stable electron emission and image display for a long time can be performed and such stable airtightness that can be applied to the FED is assured.

Second Example

Figure 4A:
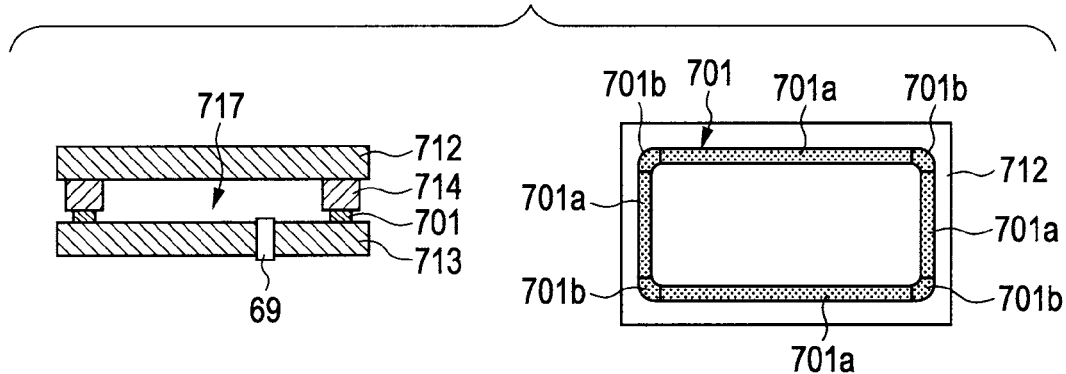
FIGS. 4A, 4B, 4C and 4D are cross sectional views and plan views illustrating an example of another manufacturing method of the hermetic container according to the embodiment of the present invention.
Figure 4B:
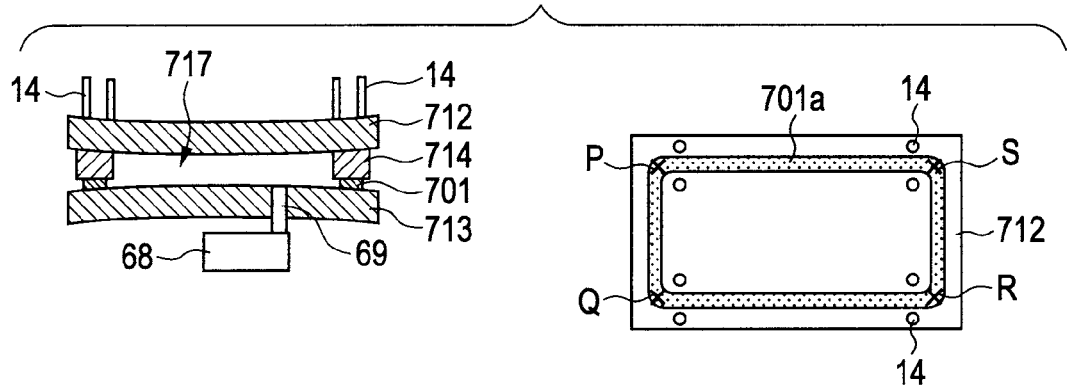
Figure 4C:
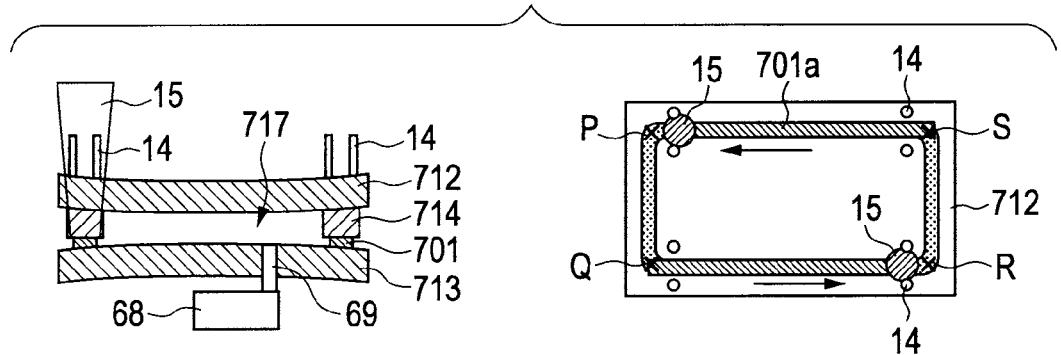
Figure 4D:
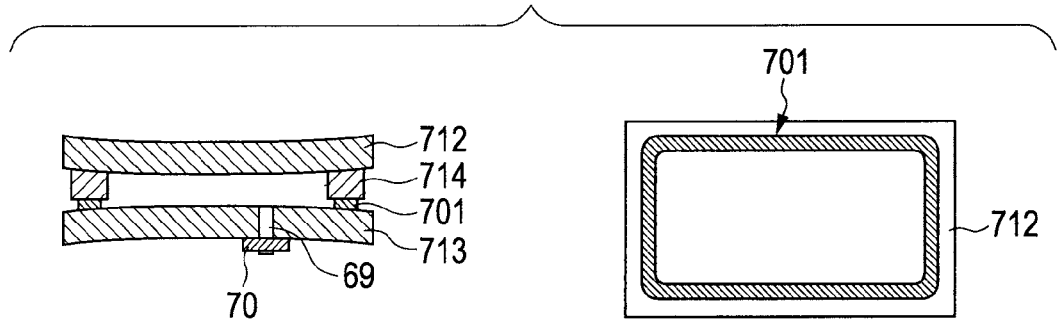

In this example, as illustrated in FIGS. 4A, 4B, 4C and 4D, the local force is applied by means of pressurizing tools 14 in the sealing step. More specifically, as illustrated in FIGS. 4B and 4C, the local force is applied by means of the pressurizing tools 14 before and during the sealing step. This example is the same as the first example except that the sealing step is performed after the coupling portion 701b at a sealing portion was locally sealed. In any case, after a laser beam was irradiated to all the sealing materials 701, the pressurizing by the pressurizing tools 14 may be canceled (refer to FIG. 4D).

Incidentally, the vicinity of the one coupling portion at the sealing portion is pressurized by a force of 0.5 N from the face plate side at every two positions by using the pressurizing tools. A contact portion of the pressurizing tool and the face plate is protected by silicone rubber (not illustrated), thereby suppressing a damage of the face plate. The region of the contact portion is a circle having a diameter of 1 mm.

As just described, the hermetic container which can be applied to an FED is completed. The completed FED was made operative, so that it has been confirmed that the stable electron emission and image display for a long time can be performed and such stable airtightness that can be applied to the FED is assured.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-075068, filed Mar. 29, 2010, which is hereby incorporated by reference herein in its entirety.

What is claimed is:

1. A manufacturing method of a hermetic container, comprising:
   an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
   a sealing step of sealing the first glass substrate and the second glass substrate to each other by performing, to all the straight line portions, a scanning step of performing scanning with local heating light along a select straight line portion of the circumferential sealing material from a first coupling portion to a second coupling portion positioned at opposite ends of the select straight line portion to heat and melt the select straight line portion,
   wherein the sealing step is performed in a state that a local force is applied to the circumferential sealing material, an intensity of the local force applied to a first one of the opposite ends adjacent to another straight line portion later heated and melted is larger than that of the local force applied to the select straight line portion such that the first end adjacent to the another straight line portion later heated and melted is compressed in a thickness direction of the sealing material,
   wherein, in first and second straight line portions which stretch from each of the coupling portions, a width of the first straight line portion which is precedently heated and melted is W, the local force is applied in the sealing step to, in semicircular regions which are surrounded by a circumference of which the center is an intersection point of a first center line of the first straight line portion and a second center line of the second straight line portion and of which the radius is 2 W and the second center line, the semicircular region which is positioned at an inner side of the circumferential sealing material.

2. The manufacturing method according to claim 1, wherein, in the sealing step, the local force is applied by locally pressurizing the first glass substrate and the second glass substrate with a pressurizing tool.

3. The manufacturing method according to claim 1, wherein, in the sealing step, the scanning with the local heating light to each of the coupling portions of the sealing material is performed at least twice respectively in inverse directions.

4. The manufacturing method according to claim 1, wherein
   at least one of the first glass substrate and the second glass substrate has an exhaust hole, and
   the manufacturing method further comprises a step of, after the sealing step, sealing the exhaust hole after reducing a pressure in the internal space.

5. The manufacturing method according to claim 1, viscosity of the sealing material has negative temperature dependency.

6. A manufacturing method of a hermetic container, comprising:
   an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
   a sealing step of sealing the first glass substrate and the second glass substrate to each other by performing, to all the straight line portions, a scanning step of performing scanning with local heating light along a select straight line portion of the circumferential sealing material from a first coupling portion to a second coupling portion positioned at an opposite end of the select straight line portion to heat and melt the select straight line portion,
   wherein the sealing step is performed in a state that a local force is applied by which, in opposite ends of the straight line portions of the circumferential sealing material, one of the ends adjacent to another straight line portion later heated and melted is compressed in a thickness direction of the sealing material, and
   wherein, in first and second straight line portions which stretch from each of the coupling portions, a width of the first straight line portion which is precedently heated and melted is W, the local force is applied in the sealing step to, in semicircular regions which are surrounded by a circumference of which the center is an intersection point of a first center line of the first straight line portion and a second center line of the second straight line portion and of which the radius is 2 W and the second center line, the semicircular region which is positioned at an inner side of the circumferential sealing material.

7. The manufacturing method according to claim 6, wherein viscosity of the sealing material has negative temperature dependency.

8. A manufacturing method of a hermetic container, comprising:
an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
a sealing step of sealing the first glass substrate and the second glass substrate to each other by performing, to all the straight line portions, a scanning step of performing scanning with local heating light along a select straight line portion of the circumferential sealing material from a first coupling portion to a second positioned at an opposite end of the select straight line portion to heat and melt the select straight line portion,
wherein the sealing step is performed in a state that a local force is applied by which, in opposite ends of the straight line portions of the circumferential sealing material, one of the ends adjacent to another straight line portion later heated and melted is compressed in a thickness direction of the sealing material, and
wherein the local force is applied in the sealing step by locally sealing the first glass substrate and the second glass substrate to each other by previously and locally heating and melting the circumferential sealing material after the assembling step and before the sealing step.

9. A manufacturing method of a hermetic container, comprising:
an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
a sealing step of sealing the first glass substrate and the second glass substrate to each other by performing, to all the straight line portions, a scanning step of performing scanning with local heating light along a select straight line portion of the circumferential sealing material from a first coupling portion to a second coupling portion positioned at an opposite end of the select straight line portion to heat and melt the select straight line portion,
wherein the sealing step is performed in a state that a local force is applied by which, in opposite ends of the straight line portions of the circumferential sealing material, one of the ends adjacent to another straight line portion later heated and melted is compressed in a thickness direction of the sealing material, and
wherein in the assembling step, a local sealing material for locally sealing the first glass substrate and the second glass substrate to each other is further arranged, and
the local force is applied in the sealing step, by locally sealing the first glass substrate and the second glass substrate to each other by previously heating and melting the local sealing material before the sealing step.

10. A manufacturing method of a hermetic container, comprising:
an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
a sealing step of sealing the first glass substrate and the second glass substrate to each other by performing, to all the straight line portions, a scanning step of performing scanning with local heating light along a select straight line portion of the circumferential sealing material from a first coupling portion to a second coupling portion positioned at opposite ends of the select straight line portion to heat and melt the select straight line portion,
wherein the sealing step is performed in a state that a local force is applied to the circumferential sealing material, an intensity of the local force applied to a first one of the opposite ends adjacent to another straight line portion later heated and melted is larger than that of the local force applied to the select straight line portion such that the first end adjacent to the another straight line portion later heated and melted is compressed in a thickness direction of the sealing material,
wherein the local force is applied in the sealing step by locally sealing the first glass substrate and the second glass substrate to each other by previously and locally heating and melting the circumferential sealing material after the assembling step and before the sealing step.

11. A manufacturing method of a hermetic container, comprising:
an assembling step of aligning a first glass substrate and a second glass substrate with each other through a circumferential sealing material having plural straight line portions and plural coupling portions for connecting the plural straight line portions, so as to define an internal space between the first glass substrate and the second glass substrate; and
a sealing step of sealing the first glass substrate and the second glass substrate to each other by performing, to all the straight line portions, a scanning step of performing scanning with local heating light along a select straight line portion of the circumferential sealing material from a first coupling portion to a second coupling portion positioned at opposite ends of the select straight line portion to heat and melt the select straight line portion,
wherein the sealing step is performed in a state that a local force is applied to the circumferential sealing material, an intensity of the local force applied to a first one of the opposite ends adjacent to another straight line portion later heated and melted is larger than that of the local force applied to the select straight line portion such that the first end adjacent to the another straight line portion later heated and melted is compressed in a thickness direction of the sealing material, wherein
in the assembling step, a local sealing material for locally sealing the first glass substrate and the second glass substrate to each other is further arranged, and
the local force is applied in the sealing step, by locally sealing the first glass substrate and the second glass substrate to each other by previously heating and melting the local sealing material before the sealing step.

* * * * *